United States Patent
Shi et al.

(10) Patent No.: US 12,166,331 B2
(45) Date of Patent: Dec. 10, 2024

(54) OPTICAL DEVICE INCLUDING A SUBSTRATE WITH A CONDUCTOR-FILLED TRENCH ON A CONDUCTIVE CORE

(71) Applicant: Lumentum Operations LLC, San Jose, CA (US)

(72) Inventors: Wei Shi, San Jose, CA (US); Siu Kwan Cheung, San Jose, CA (US); Lijun Zhu, Dublin, CA (US); Raman Srinivasan, San Jose, CA (US); Huanlin Zhu, San Jose, CA (US)

(73) Assignee: Lumentum Operations LLC, San Jose, CA (US)

( * ) Notice: Subject to any disclaimer, the term of this patent is extended or adjusted under 35 U.S.C. 154(b) by 863 days.

(21) Appl. No.: 17/301,261

(22) Filed: Mar. 30, 2021

(65) Prior Publication Data

US 2022/0166187 A1 May 26, 2022

Related U.S. Application Data

(60) Provisional application No. 63/116,627, filed on Nov. 20, 2020.

(51) Int. Cl.
| | | |
|---|---|---|
| *H01S 5/024* | (2006.01) | |
| *H01S 5/02* | (2006.01) | |
| *H01S 5/02315* | (2021.01) | |
| *H01S 5/02355* | (2021.01) | |
| *H01S 5/02375* | (2021.01) | |

(Continued)

(52) U.S. Cl.
CPC ........ *H01S 5/02469* (2013.01); *H01S 5/0215* (2013.01); *H01S 5/02315* (2021.01); *H01S 5/02355* (2021.01); *H01S 5/02375* (2021.01); *H01S 5/183* (2013.01); *H01S 5/423* (2013.01)

(58) Field of Classification Search
CPC .............. H01S 5/02469; H01S 5/0215; H01S 5/02315; H01S 5/02355; H01S 5/02375; H01S 5/183; H01S 5/423; H01S 5/02325; H01S 5/02345; H01S 5/026
See application file for complete search history.

(56) References Cited

U.S. PATENT DOCUMENTS

| | | | | |
|---|---|---|---|---|
| 2006/0093002 A1* | 5/2006 | Park | ...................... | H01S 5/0236 372/50.1 |
| 2015/0099318 A1* | 4/2015 | Krasulick | ........... | H01S 5/02325 438/27 |
| 2021/0126425 A1* | 4/2021 | Lin | ........................ | H01S 5/021 |

OTHER PUBLICATIONS

Eveliina Juntunen et al., "Copper-Core MCPCB with Thermal Vias for High-Power COB LED Modules", May 2, 2013, 9 pages.

* cited by examiner

*Primary Examiner* — Yuanda Zhang
(74) *Attorney, Agent, or Firm* — Harrity & Harrity, LLP

(57) ABSTRACT

An optical device may include a substrate including a conductive core, a first layer stack on a first surface of the conductive core, a conductor-filled trench extending through the first layer stack to the conductive core such that the conductor-filled trench is on the first surface of the conductive core, and a second layer stack on a second surface of the conductive core. The optical device may include a vertical-cavity surface-emitting laser (VCSEL) chip above the conductor-filled trench. The VCSEL chip may include an array of VCSELs. A size of the conductor-filled trench may match a size of the VCSEL chip, match a size of an emission region of the array of VCSELs, or be greater than the size of the emission region of the array of VCSELs and less than the size of the VCSEL chip.

20 Claims, 11 Drawing Sheets

(51) Int. Cl.
*H01S 5/183* (2006.01)
*H01S 5/42* (2006.01)

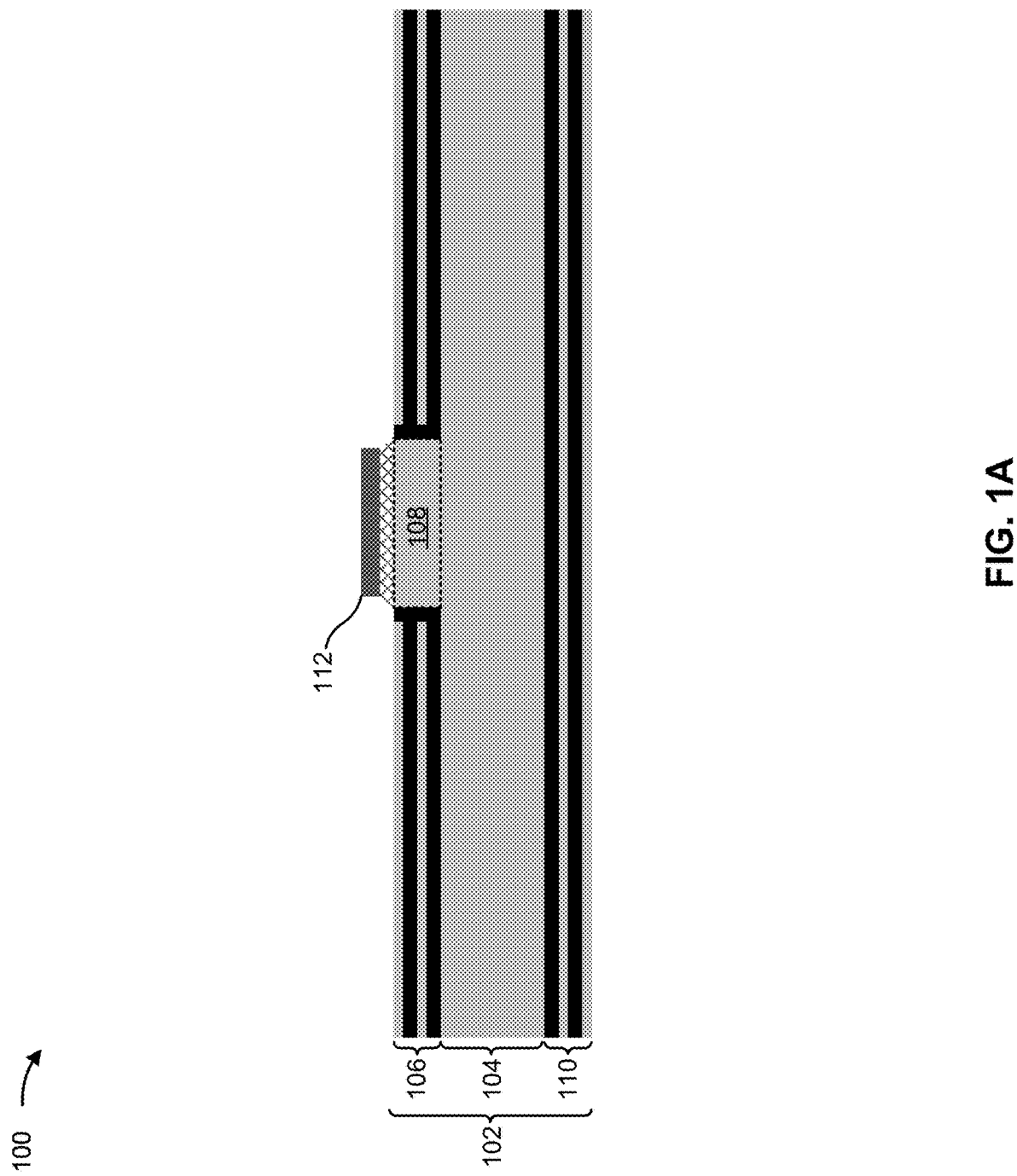

OPTICAL DEVICE INCLUDING A SUBSTRATE WITH A CONDUCTOR-FILLED TRENCH ON A CONDUCTIVE CORE

CROSS-REFERENCE TO RELATED APPLICATION

This patent application claims priority to U.S. Provisional Patent Application No. 63/116,627, filed on Nov. 20, 2020, and entitled "OPTICAL DEVICE BASED ON A SUBSTRATE WITH A COPPER TRENCH ON A COPPER CORE." The disclosure of the prior application is considered part of and is incorporated by reference into this patent application.

TECHNICAL FIELD

The present disclosure relates generally to a substrate of an optical device and, more particularly, to a substrate of an optical device, where the substrate includes a conductive core that provides improved heat dissipation for a vertical-cavity surface-emitting laser (VCSEL) chip mounted on the substrate.

BACKGROUND

An optical device may include a substrate and a VCSEL chip (e.g., used to emit light to a particular application, such as a 3D sensing application), with the VCSEL chip being mounted on the substrate. In some cases, the substrate comprises a copper (Cu) core with a layer stack on a top surface of the Cu core and a layer stack on a bottom surface of the Cu core. Here, each layer stack can include layers of a glass-reinforced epoxy laminate material, such as a flame retardant 4 (FR4) material, in alternation with Cu layers. In some other cases, the substrate for the optical device comprises a high temperature co-fired ceramic (HTCC) that includes an alumina core (i.e., aluminum oxide ($Al_2O_3$)) with a layer stack on a top surface of the alumina core and a layer stack on a bottom surface of the alumina core. Here, each layer stack can include tungsten (W) layers in alternation with layers of alumina. Generally, the VCSEL chip is mounted on a surface of one of the layer stacks of the substrate.

SUMMARY

In some implementations, an optical device includes a substrate including a conductive core; a first layer stack on a first surface of the conductive core, the first layer stack comprising a first set of dielectric layers and a first set of conductive layers; a conductor-filled trench, the conductor-filled trench extending through the first layer stack to the conductive core such that the conductor-filled trench is on the first surface of the conductive core; and a second layer stack on a second surface of the conductive core, the second layer stack comprising a second set of dielectric layers and a second set of conductive layers; and includes a VCSEL chip above the conductor-filled trench, the VCSEL chip including an array of VCSELs, wherein a size of the conductor-filled trench matches a size of the VCSEL chip, matches a size of an emission region of the array of VCSELs, or is greater than the size of the emission region of the array of VCSELs and is less than the size of the VCSEL chip.

In some implementations, an optical device includes a substrate including a conductive core, a conductor-filled trench on a first surface of the conductive core, the conductor-filled trench extending through a first layer stack that is on the first surface of the conductive core; and an emitter chip mounted on the conductor-filled trench, wherein a size of the conductor-filled trench matches a size of the emitter chip, matches a size of an emission region of the emitter chip, or is greater than the size of the emission region and is less than the size of the emitter chip.

In some implementations, a substrate includes a conductive core; a first layer stack on a first surface of the conductive core, the first layer stack comprising first set of dielectric layers alternating with a first set of conductive layers; a conductor-filled trench on the first surface of the conductive core, a perimeter of the conductor-filled trench being surrounded by the first layer stack, wherein a size of the conductor-filled trench matches a size of an optical chip to be mounted on the conductor-filled trench, matches a size of an emission region of the optical chip, or is greater than the size of the emission region and is less than the size of the optical chip; and a second layer stack on a second surface of the conductive core, the second layer stack comprising a second set of dielectric layers alternating with a second set of conductive layers.

BRIEF DESCRIPTION OF THE DRAWINGS

FIGS. 1A-1D are diagrams associated with example optical devices including a substrate with a conductor-filled trench on a conductive core described herein.

DETAILED DESCRIPTION

Figure 1B:
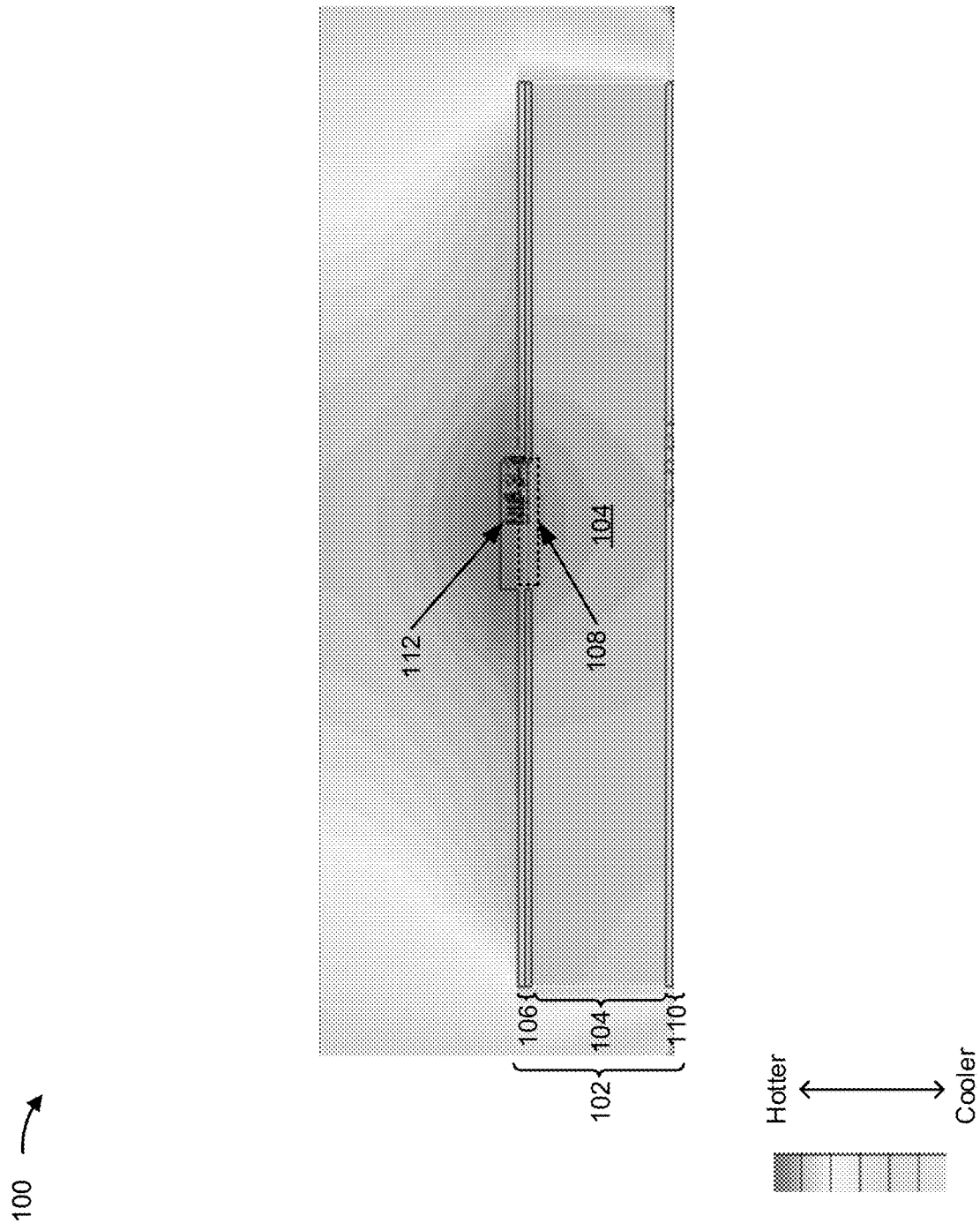

The following detailed description of example implementations refers to the accompanying drawings. The same reference numbers in different drawings may identify the same or similar elements.

Performance of a VCSEL chip in an optical device (e.g., an optical device to be used for a 3D sensing application) is impacted by a temperature of the VCSEL chip. For example, optical power, wavelength, and efficiency of the VCSEL chips are impacted by a temperature of the VCSEL chip. Therefore, because a VCSEL chip can generate a significant amount of heat during operation, a thermal design of the optical device is an important design consideration.

As described above, a substrate for an optical device in some cases is a Cu core with stacks of FR4 and Cu layers (herein referred to as a Cu-core FR4 substrate) or is an HTCC substrate, with the VCSEL chip being mounted on a surface of one of the layer stacks of the substrate. However, Cu-core FR4 substrates and HTCC substrates both have a high thermal resistance, meaning that heat generated by the VCSEL chip does not dissipate significantly into these types of substrates. This lack of heat dissipation means that temperature at the VCSEL chip may become high enough such that performance of the VCSEL chip (e.g., in terms of optical power, wavelength, or efficiency) is degraded.

In the case of an HTCC substrate, higher inductance is caused by the relatively thick dielectric core in manufacturing, meaning that a rise time and a fall time of an optical pulse provided by the VCSEL chip when using an HTCC substrate are longer than those of an optical pulse provided by the VCSEL chip when using a Cu-core FR4 substrate. Further, depending on a layout, an HTCC substrate may have higher electrical power consumption than a Cu-core FR4 substrate due to the resistivity of W being up to three times the resistivity of Cu. Therefore, Cu-core FR4 substrates may in general be preferred over HTCC substrates for inclusion in an optical device with a VCSEL chip.

In some cases, when using the Cu-core FR4 substrate described above, a Cu coin can be mechanically inserted on a surface of the substrate to provide heat conduction in a vertical direction. However, a VCSEL chip may have an area on the order of approximately 1 square millimeter ($mm^2$) or smaller, and a size (e.g. copper coins typically have 6 mm or greater diameter) and tolerances associated with mechanically inserting a Cu coin are too large to be practically useful for a VCSEL chip of such small size. Additionally, challenges in manufacturability prevent a Cu-core FR4 substrate structure with a Cu coin inserted on (e.g., in contact with) the Cu core from being practical. The too large size of Cu coins (e.g., 6 mm diameter) may also be disadvantageous because such a large Cu coin size may require other components that connect to the VCSEL to be disadvantageously far away from the VCSEL. For example, long wire bonds may be required to electrically connect from an area of the Cu-core FR4 substrate outside the Cu coin to the VCSEL (e.g., to an anode on top of the VCSEL) which may increase parasitic inductance and degrade response time for the VCSEL.

Alternatively, the Cu-core FR4 substrate described above may be used for heat dissipation in a horizontal direction with Cu-plated thermal vias between the VCSEL chip and the Cu core. A plurality of vias between the VCSEL chip and the Cu-core leave areas of FR4 substrate between the vias, which reduces thermal performance and provides uneven heat dissipation across the VCSEL chip. Both the Cu coin implementation and the horizontal heat dissipation implementation have limited heat conduction from the VCSEL chip to the Cu-core and also do not provide sufficient thermal performance. and.

Some aspects described herein provide a substrate including a conductor-filled trench that enables improved heat dissipation for a VCSEL chip. In some implementations, the substrate includes a conductive core, a first layer stack on a first surface of the conductive core (e.g., comprising a first set of dielectric layers and a first set of conductive layers), a conductor-filled trench, and a second layer stack on a second surface of the conductive core (e.g., a comprising a second set of dielectric layers and a second set of conductive layers). In some implementations, the conductor-filled trench extends through the first layer stack to the conductive core such that the conductor-filled trench is on the first surface of the conductive core. In some implementations, a VCSEL chip including an array of VCSELs is mounted above the conductor-filled trench, and a size of the conductor-filled trench matches a size of the VCSEL chip, matches a size of an emission region of the array of VCSELs, or is greater than the size of the emission region of the array of VCSELs and is less than the size of the VCSEL chip. Alternatively, in some implementations, the size of the conductor-filled trench is larger than the size of the VCSEL chip. In some implementations, the conductor-filled trench is a first conductor-filled trench and the substrate further includes a second conductor-filled trench that extends through the second layer stack to the conductive core such that the second conductor-filled trench is on the second surface of the conductive core. Additional details are provided below.

In some implementations, the substrate with the conductor-filled trench has a significantly reduced thermal resistance (e.g., as compared to the conventional Cu-core FR4 substrate or the HTCC substrate described above), meaning that a heat dissipation capability for the VCSEL chip is significantly improved. As a result, performance of the VCSEL chip (e.g., in terms of optical power, wavelength, or efficiency) is improved by the substrate including the conductor-filled trench. Further, the substrate described herein provides faster response times and lower power consumption than the HTCC substrate described above. For example, faster response times may be possible because a proximity of the VCSEL to other components on the substrate can be reduced. For example, wire bonds from an area of the substrate outside of the conductor-filled trench to the VCSEL (e.g. to an anode on top of the VCSEL) are shorter because a size of the conductor-filled trench approximates, or closely matches, a size of the VCSEL. Shorter wire bonds to the VCSEL may decrease parasitic inductance and improve response time for the VCSEL. This shorter distance enables transmission of a higher-speed signal, and therefore improves performance of the optical device (e.g., by providing increased resolution for a time-of-flight camera).

FIGS. 1A-1D are diagrams associated with an example optical device 100 including a substrate with a conductor-filled trench on a conductive core described herein. As shown in FIG. 1A, in some implementations, optical device 100 includes a substrate 102 including a conductive core 104, a first layer stack 106, a conductor-filled trench 108, and a second layer stack 110. As further shown, the optical device 100 includes a VCSEL chip 112 above the conductor-filled trench 108.

Figure 2A:
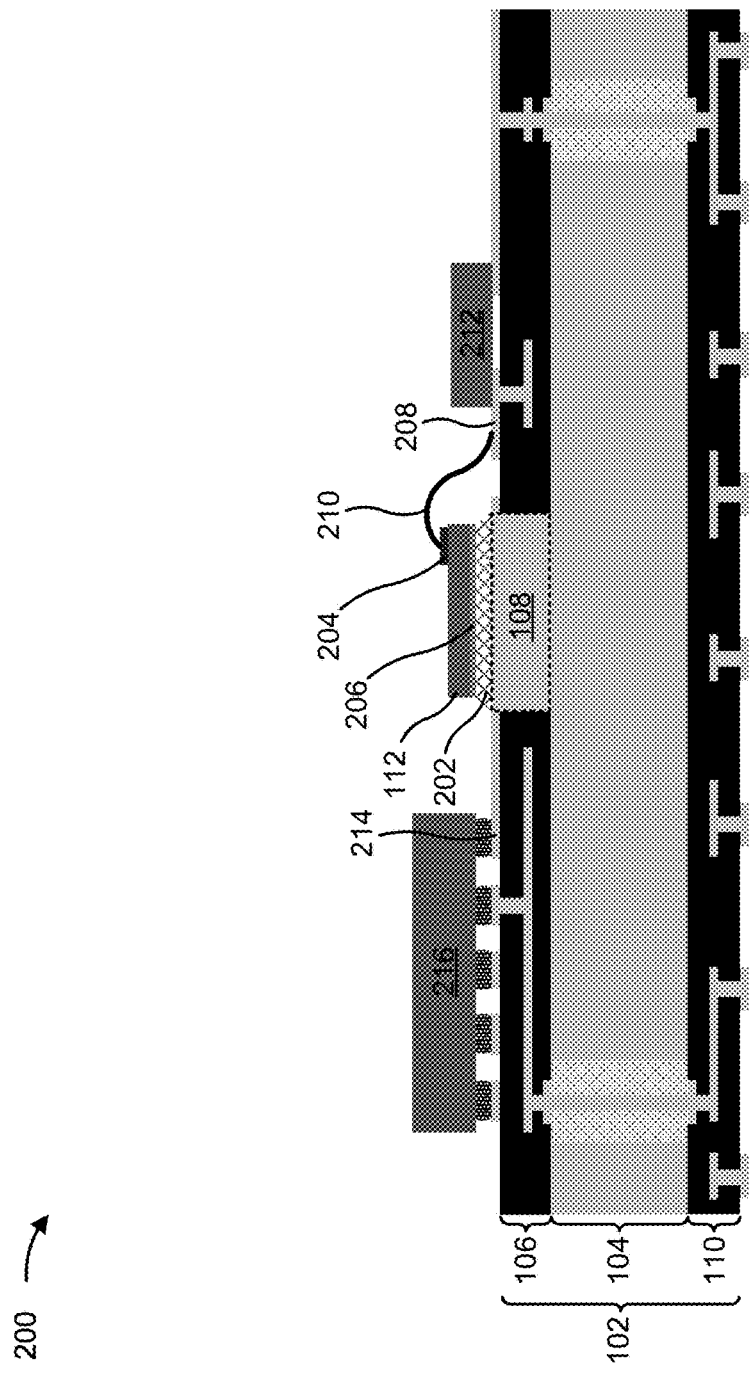
FIGS. 2A-2D are diagrams of example implementations of optical devices including a wire-bond VCSEL chip on a substrate with a conductor-filled trench on a conductive core.

The substrate 102 is a substrate on which one or more components of the optical device 100 are mounted. The one or more components may include, for example, the VCSEL chip 112, a capacitor electrically connected to the VCSEL chip 112 (e.g., as shown in FIG. 2A), a driver that is electrically connected to the VCSEL chip 112 (e.g., as shown in FIG. 2A), or one or more other components. As noted above, the substrate 102 may include the conductive core 104, the first layer stack 106, the conductor-filled trench 108, and the second layer stack 110.

The conductive core 104 is a layer of the substrate 102 that comprises a heat conductive material to enable heat dissipation for the VCSEL chip 112 in a vertical direction or a horizontal direction (e.g., away from the VCSEL chip 112) as described herein. In some implementations, the conductive core 104 may comprise, for example, Cu, another type of metal, or another type of material that enables heat dissipation for the VCSEL chip 112. In some implementations, the conductive core 104 may have a thickness in a range from approximately 100 microns (μm) to approximately 2000 μm, such as 750 μm.

The first layer stack 106 is a layer stack on a first (e.g., top) surface of the conductive core 104. In some implementations, the first layer stack 106 includes a first set of dielectric layers (the black layers in the first layer stack 106 in FIG. 1A) and a first set of conductive layers (the gray layers in the first layer stack 106 in FIG. 1A), where the first set of dielectric layers alternates with the first set of conductive layers within the first layer stack 106. For example, the first layer stack 106 may include a first dielectric layer on the top surface of the conductive core 104, a first conductive layer on the first dielectric layer, a second dielectric layer on the first conductive layer, a second conductive layer on the second dielectric layer, and so on. In some implementations, the first set of dielectric layers and the first set of conductive layers may each include multiple layers (e.g., two layers, three layers, four layers, six layers, or more) as may be desired for electrical traces or electrical connections to other components on the substrate 102. In some implementations, as shown in FIG. 1A, the first set of conductive layers of the first layer stack 106 may be isolated from the conductor-filled trench 108 by a dielectric region in the first layer stack 106. In some implementations, a given dielectric layer in the first layer stack 106 may comprise, for example, a glass-reinforced epoxy laminate material, such as an FR4 material. In some implementations, a thickness of the given dielectric layer in the first layer stack 106 may be in a range from approximately 5 µm to approximately 40 µm, such as 35 µm. In some implementations, a given conductive layer in the first layer stack 106 may comprise, for example, a Cu layer, another type of metal, or another type of electrically conductive material. In some implementations, a thickness of the given conductive layer in the first layer stack 106 may be in a range from approximately 5 µm to approximately 100 µm, such as 10 µm.

The conductor-filled trench 108 is a structure of the substrate 102 that comprises a heat conductive material to enable heat dissipation for the VCSEL chip 112 in a vertical direction (e.g., in a direction from the VCSEL chip 112 toward the conductive core 104). In some implementations, as shown in FIG. 1A, the conductor-filled trench 108 extends through the first layer stack 106 to the conductive core 104 such that the conductor-filled trench 108 is on (e.g., is connected to, is in contact with, or the like) the first surface of the conductive core 104. In some implementations, the conductor-filled trench 108 may comprise, for example, Cu, another type of metal, or another type of material that enables heat dissipation for the VCSEL chip 112. In some implementations, the conductor-filled trench 108 may have a length or a width in a range from approximately 0.5 mm to approximately 6.0 mm. In some implementations, the conductor-filled trench 108 may have an area in a range from approximately 0.25 mm² to approximately 36 mm². In some implementations, the conductor-filled trench 108 may have a length and a width of approximately 1 mm or an area of approximately 1 mm². In some implementations, the conductor-filled trench 108 may have a thickness in a range from approximately 20 µm to approximately 200 µm (when the first layer stack 106 is a double layer stack) or in a range from approximately 30 µm to approximately 300 µm (when the first layer stack 106 is a triple layer stack). In some implementations, the thickness of the conductor-filled trench 108 may be approximately equal to a thickness of the first layer stack 106. In some implementations, the conductor-filled trench 108 is formed or embedded in the first layer stack 106 such that a perimeter of the conductor-filled trench 108 is surrounded by the first layer stack 106. In some implementations, a size of the conductor-filled trench 108 (e.g., a length, a width, or an area of the conductor-filled trench 108) matches (e.g., differs from by less than a manufacturing tolerance) or is larger than a size of an emission region of the array of VCSELs of the VCSEL chip 112. In some implementations, the size of the conductor-filled trench 108 matches a size of the VCSEL chip 112, matches a size of an emission region of the array of VCSELs of the VCSEL chip 112, or is greater than the size of the emission region of the array of VCSELs and is less than the size of the VCSEL chip 112. Additional details regarding the size and shape of conductor-filled trench 108 are provided in the description associated with FIGS. 2A-2D and FIGS. 3A-3C below.

In some implementations, the conductor-filled trench 108 is a monolithic trench. That is, in some implementations, the conductor-filled trench 108 is a single conductive structure (rather than multiple adjacent conductive structures) formed in the first layer stack 106. Notably, the conductor-filled trench 108 does not comprise a via. That is, in the optical device 100, no vias are in the first layer stack 106 in a region between the VCSEL chip 112 and the conductive core 104. In some implementations, no portion of the first set of dielectric layers of the first layer stack 106 is in a region between the conductive core 104 and the emission region of the array of VCSELs. That is, no portion of the first set of dielectric layers in the first layer stack 106 is present in the conductor-filled trench 108. Put another way, in some implementations, a region between sidewalls of the conductor-filled trench 108 comprises a conductive material only (i.e., no portion of a dielectric layer of the first layer stack 106 is between the sidewalls of the conductor-filled trench 108).

In some implementations, the conductor-filled trench 108 is formed by etching a trench in the first layer stack 106 such that a surface of the conductive core 104 is exposed, and then performing a plating process (e.g., an electroplating process) to fill the trench from the surface of the conductive core 104. Here, a result of the plating process is the conductor-filled trench 108 being on (e.g., connected to, in contact with, or the like) the first surface of the conductive core 104. Plating, and particularly electroplating (also referred to as electro-chemical deposition), is a process by which conductive structures can be formed on a substrate. Plating may include applying a voltage across an anode formed of a plating material and a cathode (e.g., a substrate). The voltage causes a current to oxidize the anode, which causes the release of plating material ions from the anode. These plating material ions form a plating solution that travels through a plating bath toward the substrate. The plating solution reaches the substrate and deposits plating material ions into trenches, vias, interconnects, and/or other structures in and/or on the substrate. In some implementations, the plating process enables a metal or other type of conductive material to be deposited, such as a Cu, aluminum (Al), nickel (Ni), tin (Sn), or a compound material or alloy (e.g., tin-silver, tin-lead, and/or the like), among other examples.

The second layer stack 110 is a layer stack on a second (e.g., bottom) surface of the conductive core 104. In some implementations, the second layer stack 110 includes a second set of dielectric layers and a second set of conductive layers, where the second set of dielectric layers alternates with the second set of conductive layers in the second layer stack 110. For example, the second layer stack 110 may include a first dielectric layer on the bottom surface of the conductive core 104, a first conductive layer on the first dielectric layer, a second dielectric layer on the first conductive layer, a second conductive layer on the second dielectric layer, and so on. In some implementations, the second set of dielectric layers and the second set of conductive layers may each include multiple layers (e.g., two layers, three layers, four layers, six layers, or more). In some implementations, a given dielectric layer in the second layer stack 110 may comprise, for example, a glass-reinforced epoxy laminate material, such as an FR4 material. In some implementations, a thickness of the given dielectric layer in the second layer stack 110 may be in a range from approximately 5 µm to approximately 40 µm, such as 35 µm. In some implementations, a given conductive layer in the second layer stack 110 may comprise, for example, a Cu layer, another type of metal, or another type of electrically conductive material. In some implementations, a thickness of the given conductive layer in the second layer stack 110 may be in a range from approximately 5 µm to approximately 100 µm, such as 10 µm. In some implementations, the second layer stack 110 may be structured, formed and/or processed in a similar manner to first layer stack 106.

The VCSEL chip 112 is a chip comprising an array of VCSELs. In some implementations, the VCSEL chip 112 may be electrically connected to one or more other components mounted on the substrate 102. For example, an anode of the VCSEL chip 112 may be electrically connected to a capacitor mounted on the substrate 102 (e.g., as shown in FIG. 2A) and a cathode of the VCSEL chip 112 may be electrically connected to a driver mounted on the substrate 102 (e.g., as shown in FIG. 2A). In some implementations, as illustrated in FIG. 1A, the VCSEL chip 112 is above or mounted on the conductor-filled trench 108 (e.g., such that the conductor-filled trench 108 is between the VCSEL chip 112 and the conductive core 104). In some implementations, the VCSEL chip 112 may be a wire-bond VCSEL chip, or may be a flip-chip bond VCSEL chip, examples of which are illustrated below with respect to FIGS. 2A-2D and FIGS. 3A-3C, respectively.

In some implementations, the conductor-filled trench 108 in the substrate 102 of the optical device 100 shown in FIG. 1A enables heat from the VCSEL chip 112 to dissipate through the conductor-filled trench 108 and into the conductive core 104. FIG. 1B is an example of a heat map illustrating heat dissipation provided by the conductor-filled trench 108 of the optical device 100. As shown in FIG. 1B, the conductor-filled trench 108 enables heat dissipation throughout the conductive core 104 (e.g., in a vertical direction through the conductive core 104 and in horizontal directions away from the conductor-filled trench 108).

Figure 1C:
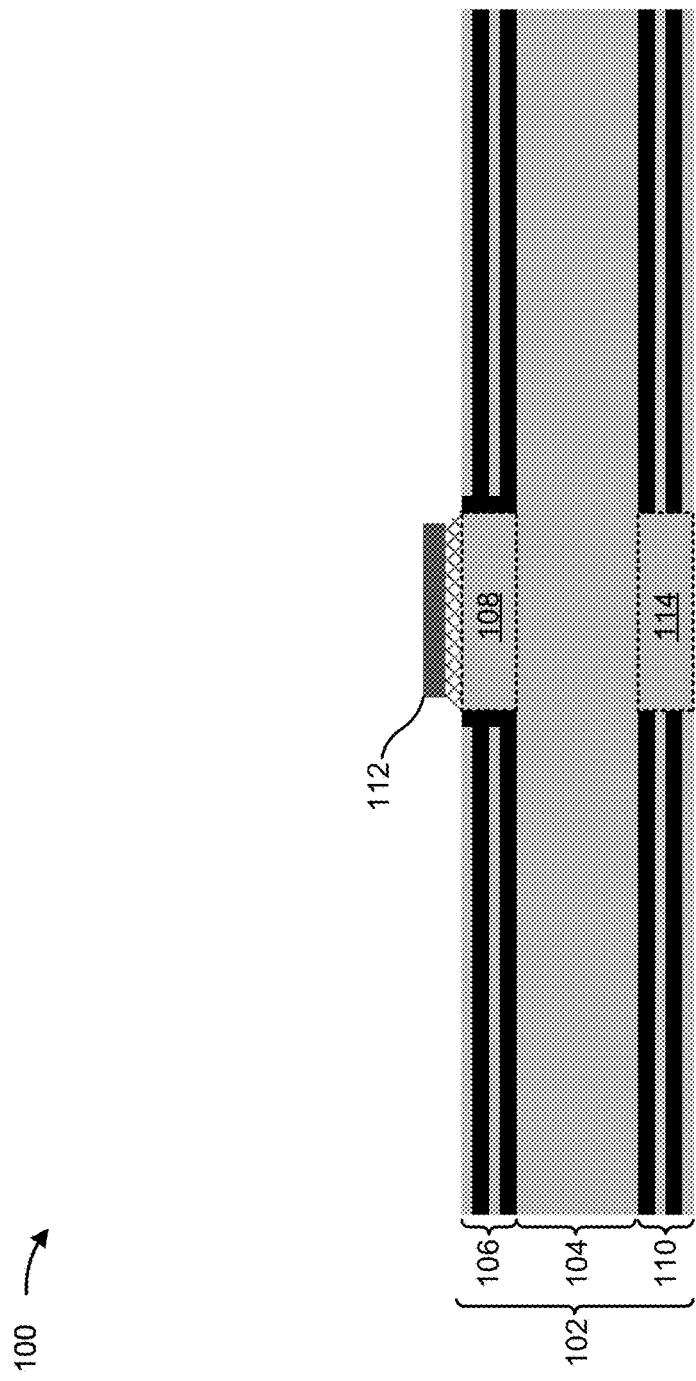

In some implementations, the optical device 100 includes another conductor-filled trench on a second surface of the conductive core 104. FIG. 1C is a diagram of an optical device 100 that includes a conductor-filled trench 114 on a second (e.g., bottom) surface of the conductive core 104 (in addition to the conductor-filled trench 108 on the first surface of the conductive core 104). In some implementations, as shown in FIG. 1C, the conductor-filled trench 114 is opposite the conductor-filled trench 108 such that the VCSEL chip 112 is above both conductor-filled trench 108 and conductor-filled trench 114. In some implementations, conductor-filled trench 114 may have a larger size (e.g. diameter, width and/or thickness) compared to conductor-filled trench 108 because the size of conductor-filled trench 114 may not be limited by the VCSEL chip.

The conductor-filled trench 114 is a structure of the substrate 102 that comprises a heat conductive material to enable further heat dissipation for the VCSEL chip 112 in a vertical direction (e.g., away from the conductive core 104 toward a bottom of the substrate 102). In some implementations, the conductor-filled trench 114 extends through the second layer stack 110 to the conductive core 104 such that the conductor-filled trench 114 is on (e.g., is connected to, is in contact with, or the like) the second surface of the conductive core 104. In some implementations, the conductor-filled trench 114 may comprise, for example, Cu, another type of metal, or another type of material that enables heat dissipation for the VCSEL chip 112. In some implementations, the conductor-filled trench 114 may have a length or a width in a range from approximately 0.5 mm to approximately 6 mm. In some implementations, the conductor-filled trench 114 may have an area in a range from approximately 0.25 mm² to approximately 36 mm². In some implementations, the conductor-filled trench 114 may have a length and a width of approximately 1 mm or an area of approximately 1 mm². In some implementations, the conductor-filled trench 114 may have a thickness in a range from approximately 20 µm to approximately 200 µm (e.g., when the second layer stack 110 is a double layer stack) or in a range from approximately 30 µm to approximately 300 µm (e.g., when the second layer stack 110 is a triple layer stack). In some implementations, the thickness of the conductor-filled trench 114 may be approximately equal to a thickness of the second layer stack 110. In some implementations, a size (e.g., a width, a length, or an area) or a thickness of the conductor-filled trench 114 may match (e.g., differ from by less than a manufacturing tolerance) a size or a thickness, respectively, of the conductor-filled trench 108. In some implementations, the conductor-filled trench 114 is formed or embedded in the second layer stack 110 such that a perimeter of the conductor-filled trench 114 is surrounded by the second layer stack 110. In some implementations, a size of the conductor-filled trench 114 (e.g., a length, a width, or an area of the conductor-filled trench 108) matches (e.g., differs from by less than a manufacturing tolerance) or is larger than a corresponding size of an emission region of the array of VCSELs of the VCSEL chip 112. In some implementations, the conductor-filled trench 114 may have characteristics or features similar to those of the conductor-filled trench 108 as described herein. In some implementations, the conductor-filled trench 114 is formed by etching a trench in the second layer stack 110 such that a surface of the conductive core 104 is exposed, and then performing a plating process (e.g., an electroplating process) to fill the trench from the surface of the conductive core 104. Here, a result of the plating process is the conductor-filled trench 114 being on (e.g., connected to, in contact with, or the like) the second surface of the conductive core 104. In some implementations, the plating process used to form the conductor-filled trench 114 may be similar to the plating process used to form the conductor-filled trench 108 as described above. In some implementations, the conductor-filled trench 114 is structured, formed and/or processed in a similar manner to conductor-filled trench 108.

Figure 1D:
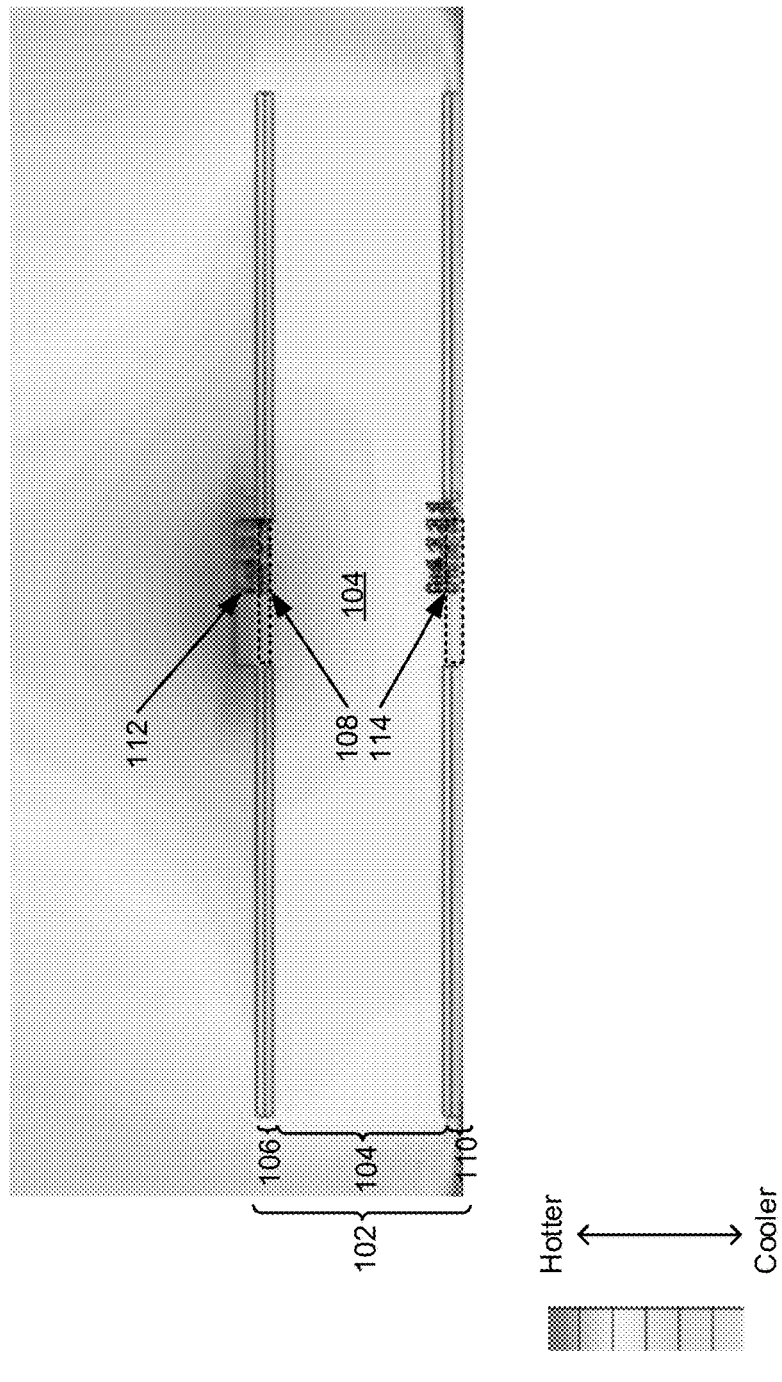

In some implementations, the conductor-filled trench 114 in the substrate 102 of the optical device 100 shown in FIG. 1C enables heat from the VCSEL chip 112 to dissipate through the conductive core 104 (e.g., to a bottom of the substrate 102). FIG. 1D is an example of a heat map illustrating heat dissipation provided by the conductor-filled trench 108 and the conductor-filled trench 114 of the optical device 100. As shown in FIG. 1D, the conductor-filled trench 108 and the conductor-filled trench 114 enable heat dissipation throughout the conductive core 104 (e.g., in a vertical direction through the substrate and in horizontal directions away from the conductor-filled trench 108).

As indicated above, FIGS. 1A-1D are provided as an example. Other examples may differ from what is described with regard to FIGS. 1A-1D. The number and arrangement of layers, structures, or components shown in FIGS. 1A-1D are provided as an example. In practice, there may be additional layers, structures, or components, fewer layers, structures, or components, different layers, structures, or components, or differently arranged layers, structures, or components than those shown in FIGS. 1A-1D. Further, while the VCSEL chip 112 described here is a described as a chip including an array of VCSEL chips 112, the VCSEL chip 112 may in practice be another type of optical chip (e.g., another type of optical chip for which heat dissipation is needed).

Figure 2B:
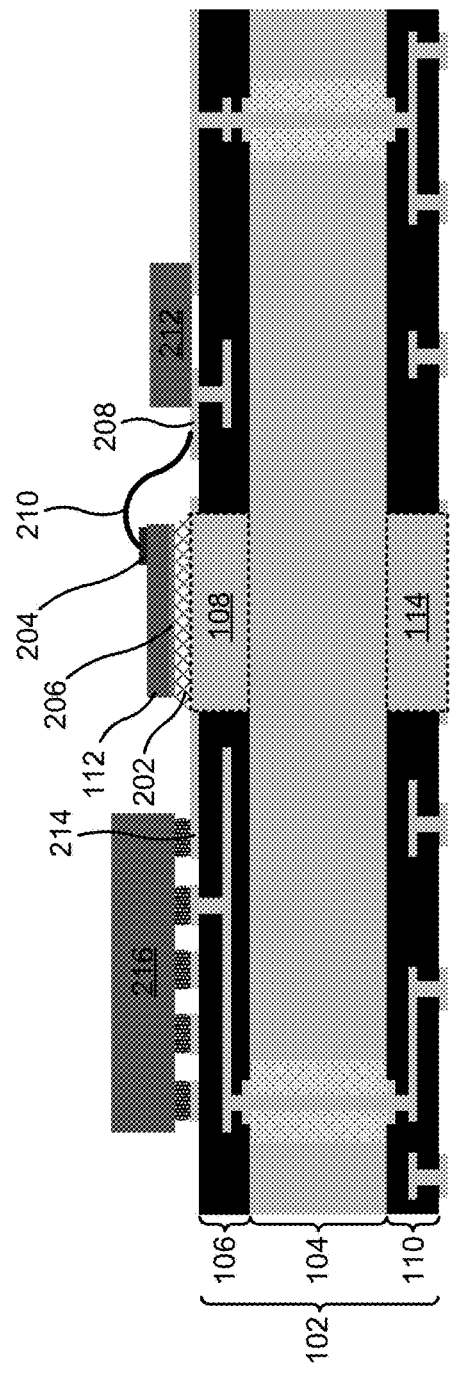

FIGS. 2A-2D are diagrams associated with example implementations of an optical device 200 including a wire-bond VCSEL chip 112 above a conductor-filled trench 108 in a substrate 102. FIG. 2A is a diagram of an optical device 200 including the conductor-filled trench 108, while FIG. 2B is a diagram of an optical device 200 including the conductor-filled trench 108 and the conductor-filled trench 114. As shown in FIGS. 2A and 2B, the optical devices 200 include the substrate 102 comprising the conductive core 104, the first layer stack 106, the conductor-filled trench 108, and the second layer stack 110. As further shown, the optical devices 200 include a conductive adhesive 202 (e.g., an anisotropic conductive paste (ACP) epoxy, a B-stage film epoxy, a solder paste, a gold epoxy, or the like), an anode bond pad 204, a cathode bond pad 206, a capacitor bond pad 208, a wire bond 210, a capacitor 212, a driver bond pad 214, and a driver 216. As illustrated in FIGS. 2A and 2B, the conductive layers of the first layer stack 106 and the second layer stack 110 may be used for routing of electrical signals in the optical device 200. Notably, portions of the routing passing through the conductive core 104 may be isolated from the conductive core 104 (e.g., by an insulating dielectric material), as indicated by the hashed areas in the conductive core 104 in FIGS. 2A and 2B.

In the optical devices 200 shown in FIGS. 2A and 2B, the VCSEL chip 112 is a wire-bond VCSEL chip. For example, the anode bond pad 204 of the VCSEL chip 112 is electrically connected to the capacitor 212 through the wire bond 210 and the capacitor bond pad 208 (e.g., which may be formed from a portion of a top conductive layer of the first layer stack 106). As further shown, the cathode bond pad 206 is electrically connected to the driver 216 through the driver bond pad 214 (e.g., which may be formed from a portion of the top conductive layer of the first layer stack 106).

Figure 2C:
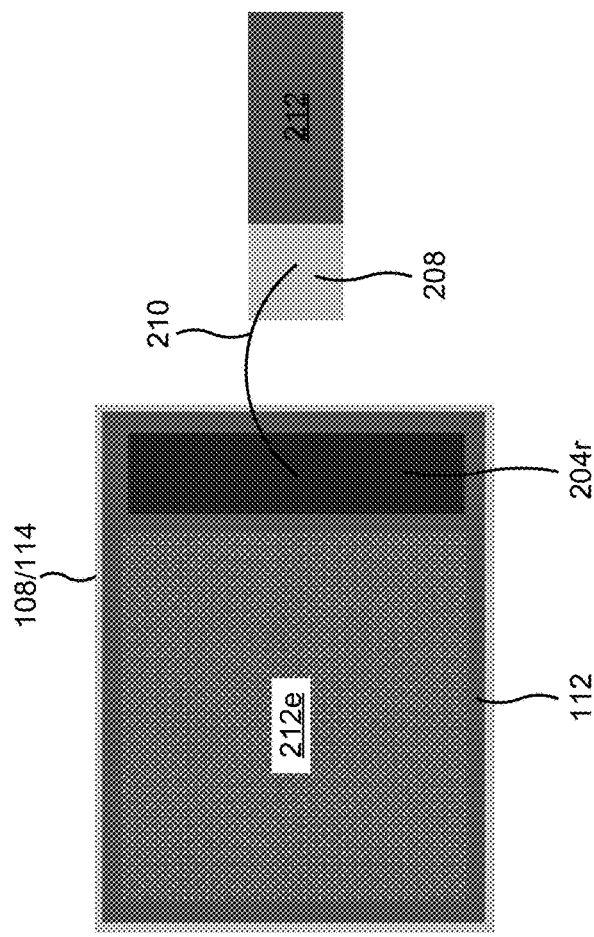

In some implementations, as noted above, a size (e.g., a width, a length, or an area) of the conductor-filled trench 108 or a size of the conductor-filled trench 114 may match or be larger than a size of the VCSEL chip 112, and may be less than approximately 6 mm. In some implementations, the size of the conductor-filled trench 108/114 may match or be larger than a size of an emission region of the array of VCSELs of the VCSEL chip 112 and be smaller than a size of the VCSEL chip 112. For example, as shown in FIGS. 2A and 2B, the area of the conductor-filled trench 108/114 may match or be slightly larger than an area of the VCSEL chip 112. FIG. 2C is a top view diagram of the optical devices 200 shown in FIGS. 2A and 2B, where the conductor-filled trench 108/114 has an area that matches or is slightly larger than the area of the VCSEL chip 112. Notably, in the example shown in FIG. 2C, the conductor-filled trench 108 is between the emission region 212e and the conductive core 104 and is between an anode bond pad region 204r of the VCSEL chip 112 and the conductive core 104. As further indicated in FIG. 2C, in some implementations, a shape of the conductor-filled trench 108/114 matches a shape of the VCSEL chip 112. For example, the conductor-filled trench 108/114 and the VCSEL chip 112 may be rectangular in shape.

Figure 2D:
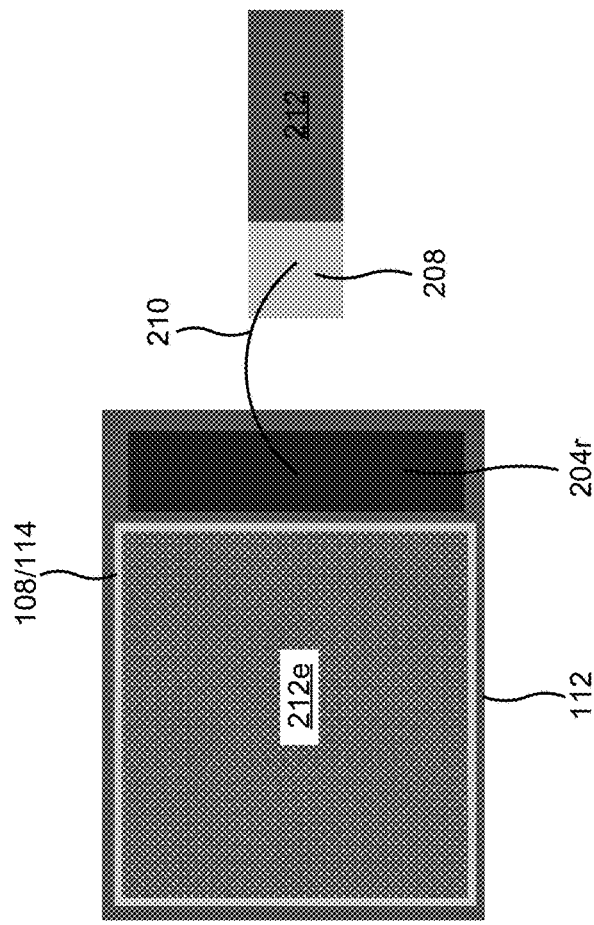

As another example, in some implementations, the area of the conductor-filled trench 108/114 matches or is larger than an area of the emission region 212e of the VCSEL chip 112. That is, in some implementations, the size of the conductor-filled trench 108/114 is greater than the size of the emission region of the array of VCSELs and is less than the size of the VCSEL chip 112. FIG. 2D is a top view diagram of an example optical device 200 where the conductor-filled trench 108/114 has an area that matches or is larger than the area of the emission region 212e of the VCSEL chip 112. Notably, in the example shown in FIG. 2D, the conductor-filled trench 108 is between the emission region 212e of the VCSEL chip 112 and the conductive core 104, but is not between the anode bond pad region 204r of the VCSEL chip 112 and the conductive core 104. In other words, a non-emission area of the VCSEL chip 112 (e.g., anode bond pad region 204r) may be aligned with (e.g., located on, over, on top of, or the like) a portion of the substrate 102. As further indicated in FIG. 2D, in some implementations, a shape of the conductor-filled trench 108/114 matches a shape of the emission region 212e. For example, the conductor-filled trench 108/114 and the emission region 212e may be rectangular in shape.

As indicated above, FIGS. 2A-2D are provided as an example. Other examples may differ from what is described with regard to FIGS. 2A-2D. The number and arrangement of layers, structures, or components, shown in FIGS. 2A-2D are provided as an example. In practice, there may be additional layers, structures, or components, fewer layers, structures, or components, different layers or components, or differently arranged layers, structures, or components, than those shown in FIGS. 2A-2D.

Figure 3A:
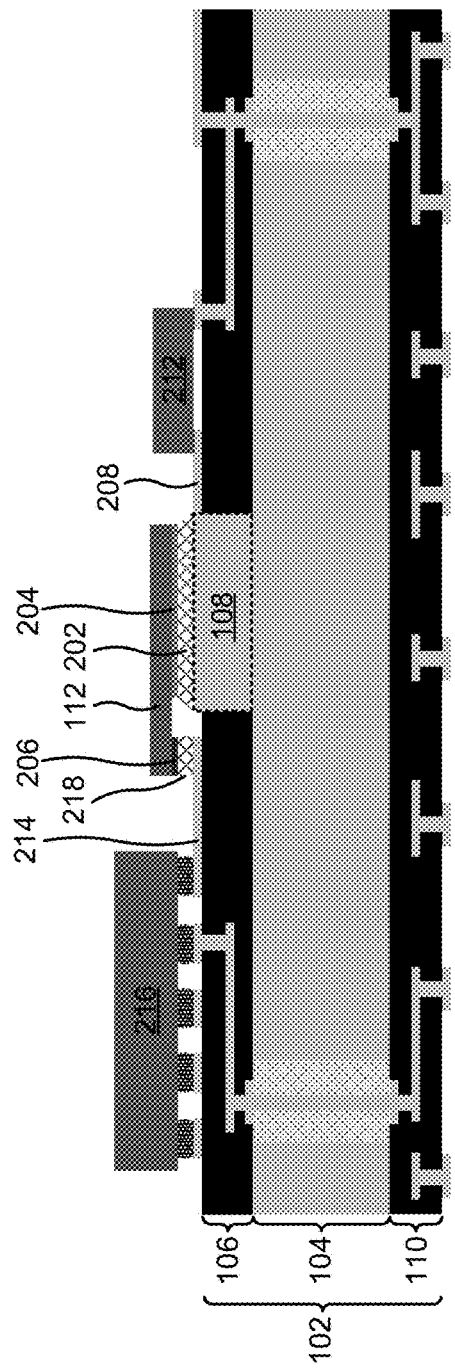
FIGS. 3A-3C are diagrams of example implementations of optical devices including a flip-chip VCSEL chip on a substrate with a conductor-filled trench on a conductive core.
Figure 3B:
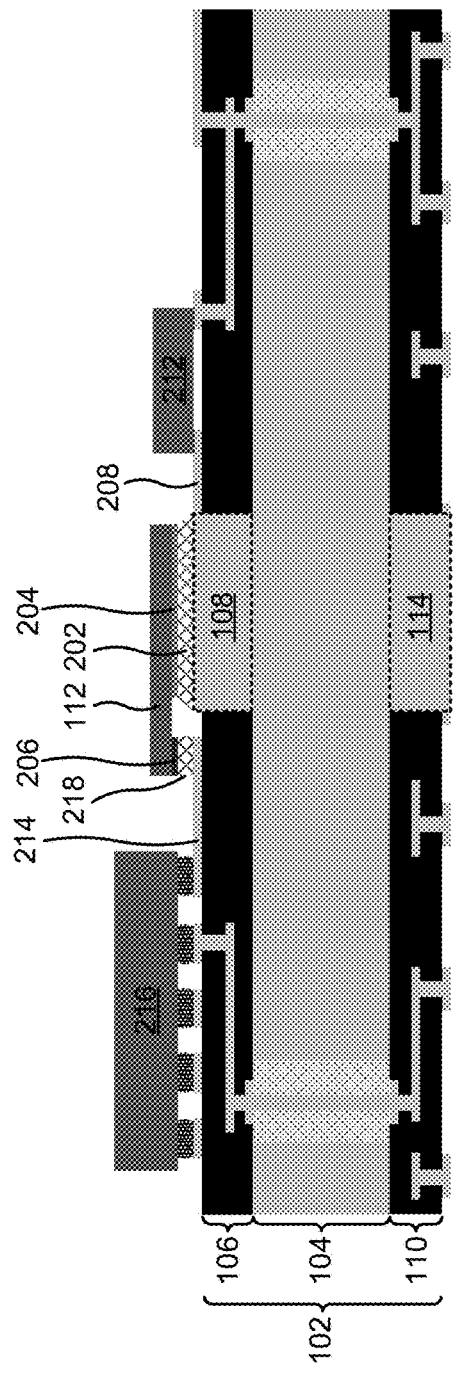
Figure 3C:
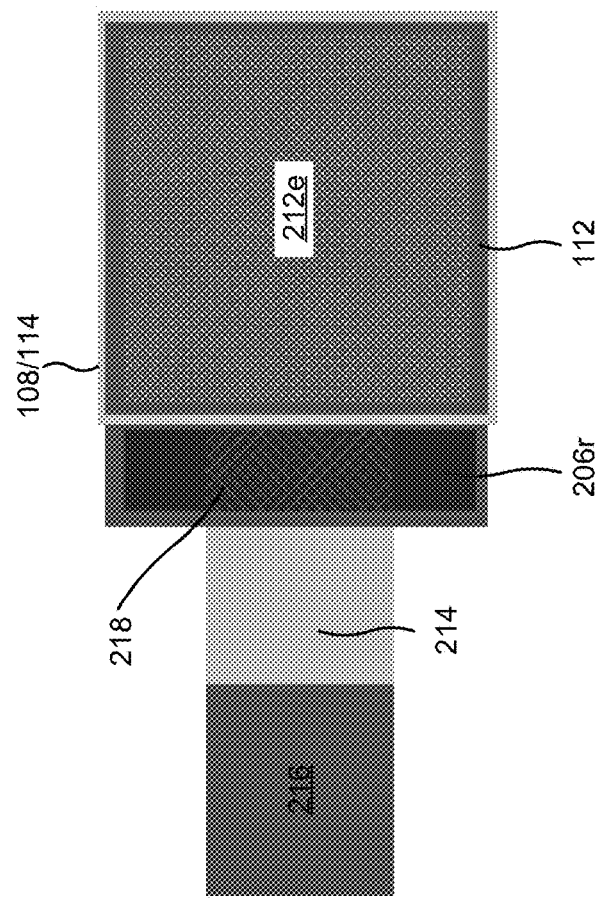

FIGS. 3A-3C are diagrams associated with example implementations of an optical device 300 including a flip-chip VCSEL chip 112 above a conductor-filled trench 108 in a substrate 102. FIG. 3A is a diagram of an optical device 300 including the conductor-filled trench 108, while FIG. 3B is a diagram of an optical device 300 including the conductor-filled trench 108 and the conductor-filled trench 114. As shown in FIGS. 3A and 3B, the optical devices 200 include the substrate 102 comprising the conductive core 104, the first layer stack 106, the conductor-filled trench 108, and the second layer stack 110. As further shown, the optical devices 200 include a conductive adhesive 202, an anode bond pad 204, a cathode bond pad 206, a capacitor bond pad 208, a capacitor 212, a driver bond pad 214, a driver 216, and a conductive adhesive 218 (e.g., an ACP epoxy, a B-stage film epoxy, a older paste, a gold epoxy, or the like). Notably, in the case of a flip-chip VCSEL chip 112, a bond pad of the VCSEL chip 112 (e.g., the anode bond pad 204 or the cathode bond pad 206) can be close to neighboring solder pads (e.g., used for the capacitor 212 or the ball grid array (BGA) driver 216) as compared to a scenario in which a mechanically-inserted Cu coin is inserted on the substrate. This shorter distance enables transmission of a higher-speed signal, and therefore improves performance of the optical device 300 (e.g., by providing increased resolution for a time-of-flight camera).

As illustrated in FIGS. 3A and 3B, the conductive layers of the first layer stack 106 and the second layer stack 110 may be used for routing of electrical signals in the optical device 300. Notably, portions of the routing passing through the conductive core 104 may be isolated from the conductive core 104 (e.g., by an insulating dielectric material), as indicated by the hashed areas in the conductive core 104 in FIGS. 3A and 3B.

In the optical devices 300 shown in FIGS. 3A and 3B, the VCSEL chip 112 is a flip-chip VCSEL chip. For example, the anode bond pad 204 of the VCSEL chip 112 is electrically connected to the capacitor 212 through the conductive adhesive 202 and the capacitor bond pad 208 (e.g., which may be formed from a portion of a top conductive layer of the first layer stack 106). As further shown, the cathode bond pad 206 is electrically connected to the driver 216 through the conductive adhesive 218 and the driver bond pad 214 (e.g., which may be formed from a portion of the top conductive layer of the first layer stack 106).

In some implementations, as noted above, a size (e.g., a width, a length, or an area) of the conductor-filled trench 108 or a size of the conductor-filled trench 114 may match or be larger than a size of an emission region of the array of VCSELs of the VCSEL chip 112. For example, as shown in FIGS. 3A and 3B, the area of the conductor-filled trench 108/114 may match an area of the emission region 212e of the VCSEL chip 112. FIG. 3C is a top view diagram of the optical devices 300 shown in FIGS. 3A and 3B, where the conductor-filled trench 108/114 has an area that matches or is larger than the area of the emission region 212e of the VCSEL chip 112. Notably, in the example shown in FIG. 3C, the conductor-filled trench 108 is between the emission region 212e of the VCSEL chip 112 and the conductive core 104, but is not between a cathode bond pad region 206r of the VCSEL chip 112 and the conductive core 104. As further indicated in FIG. 3C, in some implementations, a shape of the conductor-filled trench 108/114 matches a shape of the emission region 212e. For example, the conductor-filled trench 108/114 and the emission region 212e may be rectangular in shape.

As indicated above, FIGS. 3A-3C are provided as an example. Other examples may differ from what is described with regard to FIGS. 3A-3C. The number and arrangement of layers, structures, or components, shown in FIGS. 3A-3C are provided as an example. In practice, there may be additional layers, structures, or components, fewer layers, structures, or components, different layers, structures, or components, or differently arranged layers, structures, or components than those shown in FIGS. 3A-3C.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

As used herein, the term "size" may, depending on the context, refer to a length, a width, a thickness, an area, a volume, or the like.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. An optical device, comprising:
   a substrate including:
      a conductive core,
      a first layer stack on a first surface of the conductive core, the first layer stack comprising a first set of dielectric layers and a first set of conductive layers,
      a conductor-filled trench, the conductor-filled trench extending through the first layer stack to the conductive core such that the conductor-filled trench is on the first surface of the conductive core, and
      a second layer stack on a second surface of the conductive core, the second layer stack comprising a second set of dielectric layers and a second set of conductive layers; and
   a vertical-cavity surface-emitting laser (VCSEL) chip above the conductor-filled trench, the VCSEL chip including an array of VCSELs,
      wherein a size of the conductor-filled trench matches a size of the VCSEL chip, matches a size of an emission region of the array of VCSELs, or is greater than the size of the emission region of the array of VCSELs and is less than the size of the VCSEL chip.

2. The optical device of claim 1, wherein the conductor-filled trench is a first conductor-filled trench and the substrate further includes:
   a second conductor-filled trench extending through the second layer stack to the conductive core such that the second conductor-filled trench is on the second surface of the conductive core.

3. The optical device of claim 2, wherein the second conductor-filled trench is opposite the first conductor-filled trench such that the VCSEL chip is above the second conductor-filled trench.

4. The optical device of claim 2, wherein a size of the second conductor-filled trench matches or is larger than the size of the emission region of the array of VCSELs.

5. The optical device of claim 1, wherein a portion of the conductor-filled trench is between the conductive core and a bond pad region of the VCSEL chip.

6. The optical device of claim 1, wherein a shape of the conductor-filled trench matches a shape of the VCSEL chip.

7. The optical device of claim 1, wherein a shape of the conductor-filled trench matches a shape of the emission region of the array of VCSELs.

8. The optical device of claim 1, wherein the conductor-filled trench is a monolithic trench.

9. The optical device of claim 1, wherein the conductor-filled trench does not comprise a via.

10. The optical device of claim 1, wherein no vias are in the first layer stack in a region between the VCSEL chip and the conductive core.

11. The optical device of claim 1, wherein no portion of the first set of dielectric layers is in a region between the conductive core and the emission region of the array of VCSELs.

12. The optical device of claim 1, wherein a region between sidewalls of the conductor-filled trench comprises a conductive material only.

13. The optical device of claim 1, wherein the size of the conductor-filled trench is in a range from approximately 0.5 millimeters (mm) to approximately 6.0 mm.

14. An optical device, comprising:
a substrate including:
a conductive core,
a first conductor-filled trench on a first surface of the conductive core, the first conductor-filled trench extending through a first layer stack that is on the first surface of the conductive core, and
a second conductor-filled trench on a second surface of the conductive core, the second conductor-filled trench extending through a second layer stack that is on the second surface of the conductive core; and
an emitter chip mounted on the first conductor-filled trench,
wherein a size of the first conductor-filled trench matches a size of the emitter chip, matches a size of an emission region of the emitter chip, or is greater than the size of the emission region and is less than the size of the emitter chip, and
wherein the second conductor-filled trench is opposite the first conductor-filled trench such that the emitter chip is above the second conductor-filled trench.

15. The optical device of claim 14, wherein a shape of the first conductor-filled trench matches a shape of the emitter chip.

16. The optical device of claim 14, wherein the first conductor-filled trench is a monolithic trench.

17. A substrate, comprising:
a conductive core,
a first layer stack on a first surface of the conductive core, the first layer stack comprising first set of dielectric layers alternating with a first set of conductive layers,
a conductor-filled trench on the first surface of the conductive core, a perimeter of the conductor-filled trench being surrounded by the first layer stack,
wherein a size of the conductor-filled trench matches a size of an optical chip to be mounted on the conductor-filled trench, matches a size of an emission region of the optical chip, or is greater than the size of the emission region and is less than the size of the optical chip; and
a second layer stack on a second surface of the conductive core, the second layer stack comprising a second set of dielectric layers alternating with a second set of conductive layers.

18. The substrate of claim 17, wherein the conductor-filled trench is a first conductor-filled trench, and the substrate further comprises:
a second conductor-filled trench on the second surface of the conductive core, a perimeter of the second conductor-filled trench being surrounded by the second layer stack,
wherein a size of the second conductor-filled trench matches or is larger than the size of the emission region of the optical chip.

19. The substrate of claim 17, wherein the size of the conductor-filled trench is in a range from approximately 0.5 millimeters (mm) to approximately 6.0 mm.

20. The substrate of claim 17, wherein a portion of the conductor-filled trench is between the conductive core and a bond pad region of the optical chip.

* * * * *